(12) United States Patent
Fukuda et al.

(10) Patent No.: US 6,329,112 B1
(45) Date of Patent: Dec. 11, 2001

(54) METHOD FOR MEASURING ABERRATION OF PROJECTION LENS, METHOD FOR FORMING PATTERNS, MASK, AND METHOD FOR CORRECTING A PROJECTION LENS

(75) Inventors: Hiroshi Fukuda, Kodaira; Seiichiro Shirai, Ohme; Tsuneo Terasawa, Ohme; Katsuya Hayano, Ohme; Norio Hasegawa, Hinode, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/438,481

(22) Filed: Nov. 12, 1999

(30) Foreign Application Priority Data

Nov. 12, 1998 (JP) .................................................. 10-321685

(51) Int. Cl.$^7$ .............................. G03F 9/00; G01N 21/00; G03C 5/00
(52) U.S. Cl. ........................................... 430/30; 356/239.2
(58) Field of Search .......................... 430/5, 30; 359/648, 359/649, 727; 356/239.2, 239.3

(56) References Cited

U.S. PATENT DOCUMENTS 6,130,747 * 10/2000 Nomura et al. .................... 356/239.2

OTHER PUBLICATIONS

"Proposal for the Coma Aberration Dependent Overlay Error Compensation Technology", Jpn. J. Appl. Phys., vol. 37 (1998), pp. 6718–6722 (Part 1, No. 12B, Dec. 1998).

"Evaluation of Coma Aberration in Projection Lens by Various Measurements" Proceeding of SPIE, 3334(1998), pp. 297–308.

Extended Abstracts for the 58$^{th}$ Autumn Meeting of the Japan Society of Applied Physics, vol. 2 (1997), p. 681.

"Innovation of ULSI lithography technology (in Japanese)", Science Forum Co. Ltd. (1994),p.38.

* cited by examiner

Primary Examiner—S. Rosasco
(74) Attorney, Agent, or Firm—Antonelli, Terry, Stout & Kraus, LLP

(57) ABSTRACT

Optical systems of projection exposure apparatuses may have aberrations, and this fact may hamper the achievement of predetermined accuracy of dimensions and position of a circuit pattern which is necessary to attain desired device performance. Further, because of the difficulty in measuring the above-described aberrations, it was not possible to correct the optical system so as to realize a substantially aberration-free characteristic.

The aberrations of a projection lens can be found accurately by steps of: measuring the light intensities of a projected image of a particular pattern on a mask at n different points in the projected image; and solving n simultaneous equations with m (m<n) unknown weighting coefficients for m known wavefront aberration functions. Based on the aberrations thus found, one can adjust aberration characteristic of the projection lens or correct dimensions and positions of patterns on a mask instead.

By means of this method, the performance of semiconductor integrated circuit equipment can be improved. Further, the yield of semiconductor integrated circuits in the manufacturing process with this equipment can be improved.

13 Claims, 4 Drawing Sheets

FIG. 1

| AMOUNT OF EXPOSURE | SIDELOBE APPEARANCE PATTERN | DIRECTION | | | |
|---|---|---|---|---|---|
| | | 0 → | $\pi/4$ ↗ | $\pi/2$ ↑ | $3\pi/4$ ↖ |
| $I_6$ | | | ▮ | ▮ | |
| $I_5$ | | | | | ▪ |
| $I_4$ | | | | | |
| $I_3$ | | | | | |
| $I_2$ | | ▮ (A SIDELOBE EMERGING ONLY ON ONE SIDE) | (SIDELOBES EMERGING ON BOTH SIDES) | | |
| $I_1$ | | | | | |
| SIDELOBE INTENSITY RATIO $r(\theta)$ | | $r(0)=$ $I_4/I_2$ | $r(\pi/4)=$ $I_6/I_3$ | $r(\pi/2)=$ $I_6/I_5$ | $r(3\pi/4)=$ $I_5/I_5$ |
| DIRECTION HEADING TO A STRONG SIDELOBE FROM A WEAK SIDELOBE | | STRONG ← WEAK | WEAK ↙ STRONG | WEAK ↓ STRONG | — |

FIG. 3
AMOUNT OF EXPOSURE
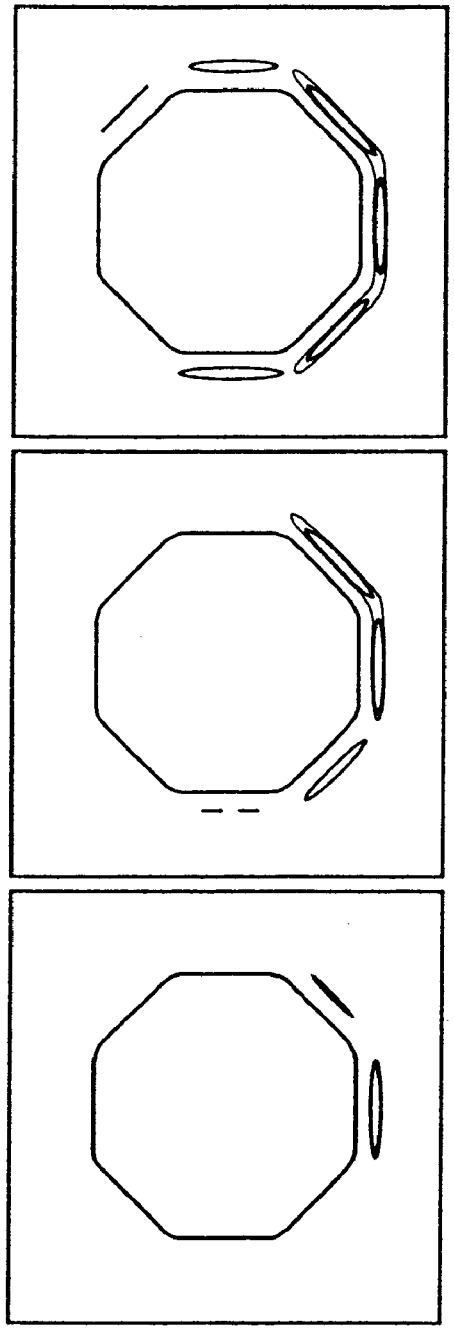
SIMULATION RESULT

TOP VIEW  SECTIONAL VIEW

TOP VIEW  SECTIONAL VIEW

METHOD FOR MEASURING ABERRATION OF PROJECTION LENS, METHOD FOR FORMING PATTERNS, MASK, AND METHOD FOR CORRECTING A PROJECTION LENS

BACKGROUND OF THE INVENTION

The present invention relates to a manufacturing process of semiconductor integrated circuit equipment, and more specifically relates to an optical system which is used to form circuit patterns on a substrate, a method for forming patterns on the substrate by the use of the same, and a mask which is used therefor.

The large-scale integration and the realization of high-performance of semiconductor integrated circuits have been promoted by improving the level of microfabrication of circuit patterns. To form circuit patterns, optical lithography is mainly used, wherein light transmitted through a mask containing a circuit pattern thereon is projected onto the substrate to perform exposure through a projection lens. In this process, a diffraction-limited optical system whose wavefront aberration is sufficiently small is used as the above-described projection lens.

On the other hand, due to a demand for higher-level microfabrication in recent years, a technology has been required that enables to form circuit patterns whose feature size is comparable to or less than the wavelength of the light used for exposure. In connection with the demand, it has become a problem that the accuracy of dimensions of transferred patterns and the accuracy of position of the same were deteriorated by wavefront aberrations that remain in the projection lens. These wavefront aberrations are caused by imperfections in designing the projection lens and manufacturing errors in its manufacturing process, and therefore it is difficult to reduce them completely to zero.

However, in order to satisfy the accuracy of pattern which is a prerequisite to attain required device performance, it is necessary to control the amount of wavefront aberrations to a sufficiently small value by realizing high-precision fabrication and adjustment of the projection lens or by counterbalancing the influence of the aberrations of the projection lens with correction of dimensions and/or positions of the patterns on the mask. To perform either method, it is indispensable to first measure the aberrations accurately and comprehend their characteristic. Recently, coma aberrations, among various aberrations, have been considered to exert significant influence on the quality of transferred patterns. Hence different methods have been tried to measure these as outlined below.

As a first method, direct measurement of the wavefront aberrations by interference measurement has been put into practice. However, an interferometer capable of measuring the projection lens for projecting circuit patterns of a semiconductor integrated circuit on the substrate is exceedingly expensive and therefore its usage is extremely limited.

On the other hand, a method was reported that evaluated coma aberrations by measuring the shift in positions of the image of a modified, deformed guide mark pattern (i.e. so-called box-in-box type), but this method can measure only the influence of third-order coma aberrations in longitudinal and transverse directions. The method for measuring the aberrations by using the shift in positions of the image of the guide mark was discussed, for example, in "Optical Microlithography XI", Proceeding of SPIE, Vol. 3334 (1998), pp. 297–308.

Furthermore, a method using an attenuating phase-shifting mask containing an octagonal opening was proposed. This method enables the estimation of third-order coma aberrations by examining a relationship among the amount of exposure at which sidelobes emerge at the vicinity of a projected image of an attenuating phase-shifting mask containing the octagonal opening, their asymmetry, and third-order coma aberrations. The half-tone phase-shift mask was discussed, for example, in Innovation of ULSI lithography technology (in Japanese)", Science Forum Co. Ltd. (1994), p.38. Furthermore, a method for measuring third-order coma aberrations using this mask was presented, for example, in Extended Abstracts for the 58th Autumn Meeting of the Japan Society of Applied Physics, Vol. 2(1997), p.681.

The wavefront aberrations which have hitherto come into question (hereinafter referred to only as aberrations for simplicity) were mainly low-order and/or third-order aberrations. However, with the demand for finer microfabrication of circuit patterns, the accuracy of dimensions and the accuracy of position of patterns which are required became more stringent, and accordingly higher-order aberrations arose as problems to be solved. That is, experimental results in such finer microfabrication could not be well explained only by third-order aberrations, and there grows a necessity to take into account the so-called fifth-order aberration terms. For example, regarding the above-described coma aberrations, the components having a dependency of $3\theta$ ($\theta$:directional angle of radius vector) in the radial angle direction among the fifth-order aberration terms have become particular problems.

However, it has been, so far, difficult to measure and comprehend these higher-order aberrations easily and quantitatively by means of any of the above-described methods. Accordingly it is hard to obtain a definite guideline about how to adjust the projection lens. In addition to this, the influence of the aberrations on a circuit pattern, to implement a countermeasure therefor, has not been capable of evaluation. As a result, higher-order aberrations became main factors that deteriorate functions and accuracy of semiconductor integrated circuit equipment and decrease the yield of integrated circuits in a manufacturing process with this equipment.

SUMMARY OF THE INVENTION

It is a first object of the present invention to provide a method for measuring the aberrations of the projection lens accurately by means of a simple technique. Specifically, the first object of the present invention is to provide a method for measuring quantitatively third- and fifth-order coma aberrations by using the attenuating phase-shifting mask containing a polygonal opening. Moreover, a second object of the present invention is to provide a method for forming circuit patterns for a semiconductor integrated circuit of a substrate, with high accuracy by means of this method.

The above-described first object is achieved by finding m aberration coefficients described below by steps of: measuring the light intensities of a projected image of a test pattern at n different points in the projected image, the test pattern being located within an isoplanatic area of the projection lens on the mask, through the projection lens whose aberration characteristic is to be measured; and solving n simultaneous equations having m (m being not larger than n) unknown weighting coefficients (=aberration coefficients) for m known wavefront aberration functions.

Here, the isoplanatic area designates a partial area within the exposure area in which the aberration characteristic of the projection lens can be assumed to be almost equivalent.

In other words, the above-described first object is achieved by a method described below, having steps of:

a method for determining aberrations of a projection lens which is used to project a pattern formed on a mask onto a body, comprising the steps of:

measuring light intensities of a projected image of a test pattern at different points in said projected image, said test pattern being located within an isoplanatic area of said projection lens on said mask; and finding m aberration coefficients by solving n simultaneous equations (m being an integer not larger than n) having said m aberration coefficients, wherein y(y=m) weighting coefficients in said simultaneous equations are treated as unknown for z(z=m) known wavefront aberration functions in said simultaneous equations, and said simultaneous equations include the result of said measuring light intensities.

In this measurement, it is convenient to use the light intensities of sidelobes that emerge in a portion of the projected image of the attenuating phase-shifting mask as the above-described light intensities. That is to say, for example, m (m being not larger than n) aberration coefficients for the above-described projection lens can be found by steps of:

transferring by exposure (hereinafter referred to as transfer for simplicity) the attenuating phase-shifting mask containing n-pairs of edges which are parallel and symmetric to each other, onto resist films applied on the substrates, with various amounts of exposure through the projection lens; measuring the amount of exposure at which a sidelobe or sidelobes emerge(s) at the vicinity of each of the above-described n-pairs of edges of the projected image of the attenuating phase-shifting mask, on respective side(s) of the half-tone light-shielding portion of the projected image; calculating ratios between the amounts of exposure thus measured, for each of the above-described n-pairs of the symmetric edges; and solving n simultaneous equations having the above-described n ratios.

More specifically, a coefficient $a_i$(i=1, ... m) corresponding to the i-th term of the wavefront aberrations $W_i(\theta)$ (i=1, ... m) for the above-described projection lens can be found, when using opposed sides of an octagonal opening (hereinafter referred to as the octagon) in a half-tone light-shielding portion of the mask as the n-pairs of edges which are parallel and symmetric to each other, by steps of:
measuring the amount of exposure at which a sidelobe emerges at the vicinity of each of the four pairs of opposed sides of the projected image of the octagon, on one side of the half-tone light-shielding portion of the projected image, in each direction normal to the opposed sides (angle $\theta$; $\theta=\theta_1$, $\theta_2$, ... $\theta_m$), respectively;

further measuring the amount of exposure at which sidelobes emerge at the vicinity of each of the four pairs of opposed sides of the projected image of the octagon, on both sides of the half-tone light-shielding portion of the projected image, in each direction normal to the opposed sides (angle $\theta$; $\theta=\theta_1$, $\theta_2$, ... $\theta_m$), respectively;

calculating each ratio r($\theta$) (angle $\theta$; $\theta=\theta_1$, $\theta_2$, ... $\theta_m$) of the latter to the former to find the maximum value of the wavefront aberrations f($\theta$) thereby for each direction (angle $\theta$; $\theta=\theta_1$, $\theta_2$, ... $\theta_m$), respectively; and solving the following simultaneous equations, $$a_1W_1(\theta)+a_2W_2(\theta)+\ldots+a_mW_m(\theta)=f(\theta) \ (\theta=\theta_1, \theta_2, \ldots \theta_m).$$

For aberrations to be found, for example, third- and fifth-order coma aberrations can be evaluated by this method.

Aberration characteristics of the projection lens can be adjusted based on the aberrations evaluated in the foregoing. Techniques for such adjustment are well known in today's lens manufacturing, and is ordinarily done when installing exposure tools in the semiconductor manufacturing environment.

Moreover, the above-described second object is achieved by forming a pattern by the use of the above-described projection lens whose aberration characteristic was adjusted based on the aberrations measured by means of the above-described method. Alternatively, the above-described second object is achieved by steps of:

estimating the influence of the aberrations, which is measured by means of the above-described method, on the change of dimensions and/or the shift in positions of the image of the pattern on a mask, preparing a mask that is corrected beforehand so as to counterbalance the above-described influence, and forming patterns on a substrate by using the mask.

BRIEF DESCRIPTION OF THE DRAWINGS

FIG. 1 is a schematic diagram showing part of a procedure of an embodiment according to the present invention.

FIG. 3 is a characteristic diagram showing the effect of an embodiment according to the present invention.

DETAILED DESCRIPTION OF THE PREFERRED EMBODIMENTS

Embodiment 1

A half-tone phase-shift mask of a pattern containing the octagon in a half-tone light-shielding portion thereof (the transmittance of the half-tone portion being 6%) was transferred onto a substrate with a resist film applied thereon at various amounts of exposures by using a KrF projection exposure apparatus. Next, the amount of exposure at which a sidelobe or sidelobes emerge(s) at the vicinity of each of the pairs of opposed sides of the projected image of the octagon, on respective side(s) of the half-tone light-shielding portion of the image, was investigated and the results shown schematically in FIG. 1 were obtained. Exposure was performed at an optimal focus position. The Table 1 summarizes ratios (more properly reciprocals of ratios) of the minimum amount of exposure at which a sidelobe emerged at one side to the minimum amount of exposure at which both sidelobes emerge at both sides (i.e. sidelobe intensity ratio) r(0), r($\pi$/4), r($\pi$/2), and r(3$\pi$/4), for each of the four pairs of opposed sides of the octagon, and their emerging turns (i.e. relation regarding which sidelobe emerges first and which sidelobe is stronger).

TABLE 1

|   | Sidelobe light intensity ratio | Phase difference |
|---|---|---|
| → | 1.1053 | 0.0361 |
| ↗ | 1.5429 | 0.0266 |

TABLE 1-continued

| | Sidelobe light intensity ratio | Phase difference |
|---|---|---|
| ↑ | 1.5429 | 0.1616 |
| ↖ | 1.2895 | 0.0938 |

By the way, it is well known that asymmetry of the sidelobes is caused by coma aberrations. At this point of discussion, assuming that third-order coma aberrations and terms having a dependency of 3θ of the fifth-order aberrations (hereinafter these terms being called fifth-order coma aberrations) are dominant, the wavefront aberration $W(r, \theta)$ is expressed in the following formula, $W(r, \theta) = a_1 r^3 \cos(\theta) + a_2 r^3 \sin(\theta) + a_3 r^3 \cos(3\theta) + a_4 r^3 \sin(3\theta) = f(\theta) r^3$, where r is a radial coordinate of a pupil (normalized such that a pupil radius is equal to unity) and θ is a directional angle of radius vector in the pupil.

Figure 2:
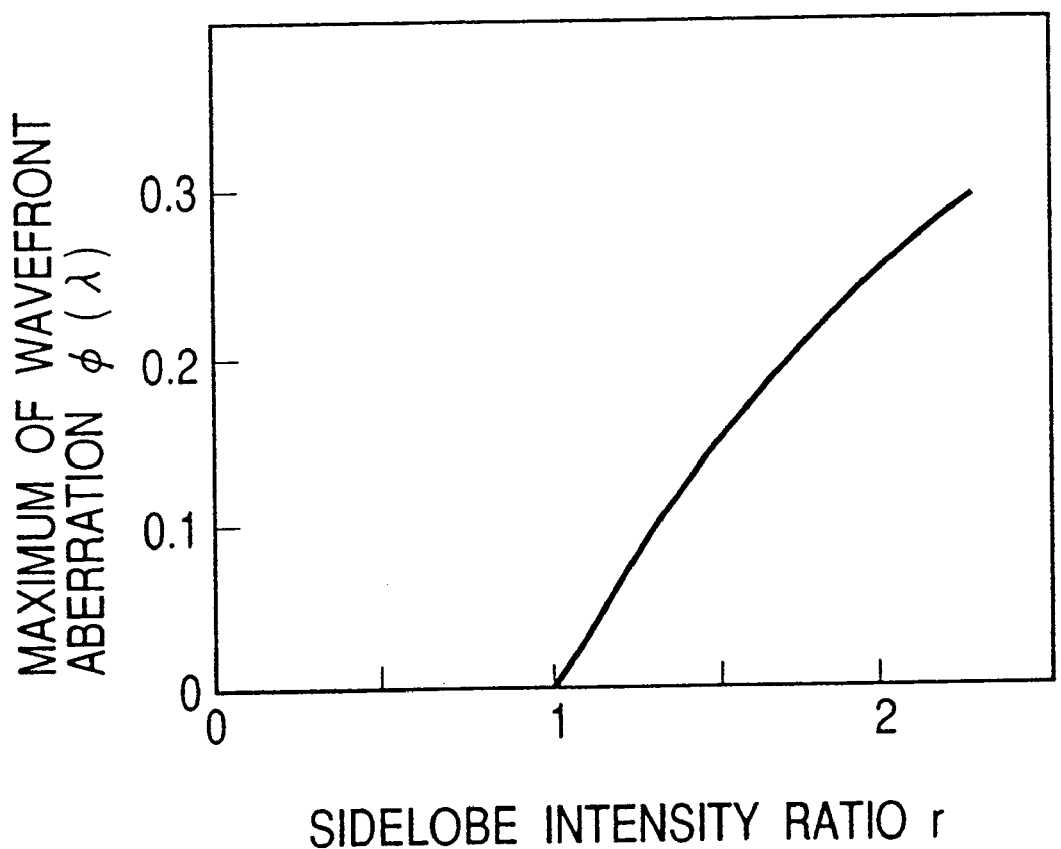
FIG. 2 is a characteristic diagram of maximum value of wavefront aberration $\phi(\lambda)$ versus sidelobe intensity ratio r which is used in an embodiment according to the present invention.

One can see that the aberrations on the pupil vary in proportion to the third power of radius r in any direction of radius and only the amount of wavefront aberration f(θ) at the edge of the pupil (r=1, that is, at the circumference of the pupil having a maximum radius) depends on the directional angle of radius vector (angle θ). At this point, if one would set the size of the octagon sufficiently large, each pair of opposed sides in the octagon can be assumed to be substantially almost a one-dimensional pattern, and therefore the asymmetry of sidelobes is determined only by the amount of wavefront aberration in each direction normal to the opposed sides (hence its maximum value f(θ)). To figure out this, a relationship between the sidelobe intensity ratio for each pair of opposed sides and the amount of maximum wavefront shift (i.e. the amount of the aberrations at the edge of the pupil) in a direction normal to the opposed sides due to coma aberrations was obtained through simulation, as shown in FIG. 2. By using this relationship, the amounts of maximum wavefront shift for respective directions normal to the opposed sides f(0), f(π/4), f(π/2), and f(3π/4) were found from the sidelobe intensity ratios for respective directions. In addition, a positive or negative sign of the wavefront shift for a direction in question was determined according to the direction heading to a strong sidelobe from a weak sidelobe. Furthermore, the relationship of FIG. 2 depends on an illumination condition (i.e. the degree of spatial coherence), a mask condition (i.e. the transmittance of the half-tone portion), etc. of a projection exposure apparatus to be employed. Therefore it is preferable to use an optimal relationship depending on these conditions. Next, the following equations were solved for f(0), f(π/4), f(π/2), and f(3π/4) which were obtained above and third- and fifth-order coma aberration coefficients $a_1$, $a_2$, $a_3$, and $a_4$ were determined.

$$a_1\cos(0) + a_2\sin(0) + a_3\cos(3^*0) + a_4\sin(3^*0) = f(0), a_1\cos(\pi/4) +$$

$$a_2\sin(\pi/4) +$$

$$a_3\cos(3^*\pi/4) +$$

$$a_4\sin(3^*\pi/4)$$

$$= f(\pi/4), a_1\cos(\pi/2) +$$

$$a_2\sin(\pi/2) +$$

$$a_3\cos(3^*\pi/2) +$$

$$a_4\sin(3^*\pi/2)$$

$$= f(\pi/2), a_1\cos(3\pi/4) +$$

$$a_2\sin(3\pi/4) +$$

$$a_3\cos(3^*3\pi/4) +$$

$$a_4\sin(3^*3\pi/4)$$

$$= f(3\pi/4)$$

Table 2 shows the obtained results. Then, using the obtained aberration coefficients, a simulation for the projected image of the octagon was conducted and its results are shown in FIG. 3. The simulation results reflected experimental results almost correctly and it was confirmed that the obtained aberration coefficients were reasonable.

TABLE 2

| $a_1$ | $a_2$ | $a_3$ | $a_4$ |
|---|---|---|---|
| −0.0057 | 0.1234 | 0.0418 | −0.0382 |

Embodiment 2

Semiconductor integrated circuit equipment was manufactured having projection exposure apparatus that incorporated a projection optical system different from that of Embodiment 1.

Figure 4A:
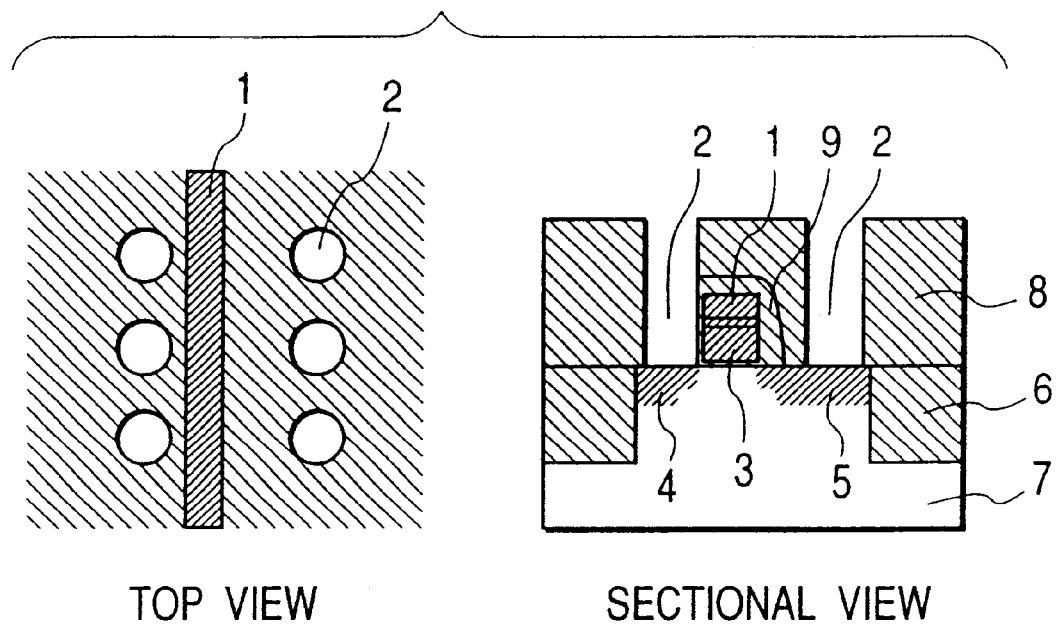
FIG. 4 is a schematic diagram showing the effect of another embodiment according to the present invention.
Figure 4B:
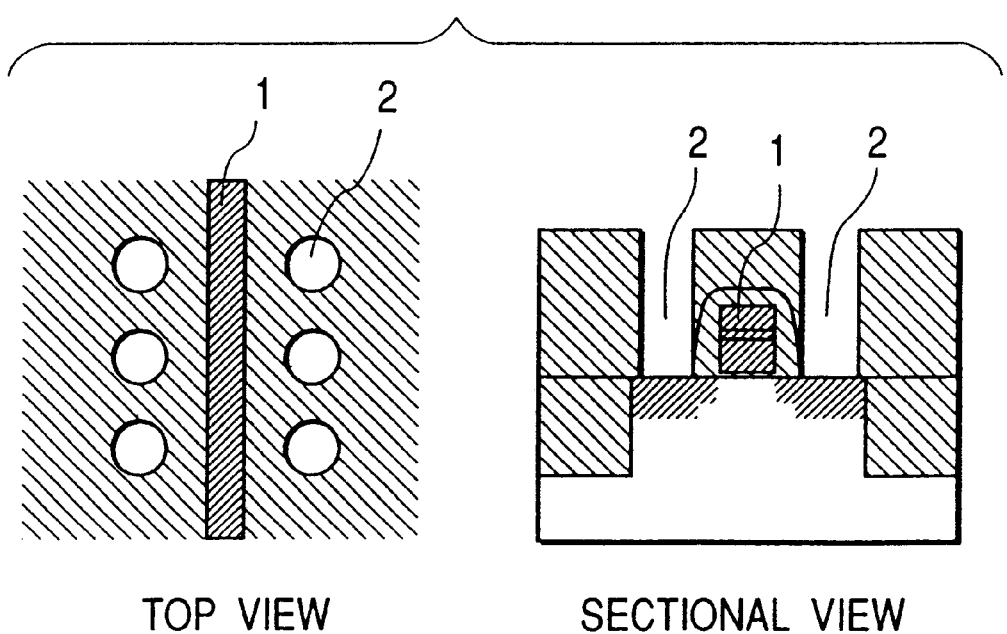

Here, description will be presented with a special attention only on a process mainly pertaining to the present invention. A linear gate pattern 1 was transferred onto the substrate having a gate film and a resist film thereon, using a delineated resist pattern as a mask; the underlying gate film was etched to process a gate, then an interlayer insulating film and a prescribed resist film were overlaid, further contact holes 2 was transferred onto a substrate, wherein a pattern of the contact holes 2 was aligned to the above-described gate pattern, and using a delineated resist pattern as a mask the underlying interlayer insulating film was etched to process the contact holes 2. FIGS. 4(a) and 4(b) illustrate top views and sectional views of part of the fabricated devices.

FIG. 4(a) is a top view and a sectional view of a device, showing a device shape schematically, that was fabricated without special adjustment to the optical system. In this fabrication, transfer positions of the contact holes 2 displaced relatively from that of the gate 1 to a large degree; and to make matters worse, the amount and direction of the displacement varied largely across the exposure area of a chip, and hence it was difficult to attain desired device function. With intent to circumvent this problem, measurement identical to that of Embodiment 1 was conducted for the above-described projection optical system and results shown in the upper column of Table 3 were obtained. Further, the adjustment of the projection lens was performed based on the results. By the way, the above-described gate 1 as well as a gate insulating film 3, a source region 4, and a drain region 5 were formed in an active area on a semiconductor substrate 7 (comprising silicon) which was partitioned with an element-isolating insulating film 6 (which comprised, for example, silicon dioxide film), and the contact holes 2 were formed through an insulating film 8 (i.e. silicon dioxide film) which was provided on the gate 1. The gate 1 shown in the figure has a polymetal structure in which a polycrystalline silicon film, a tungsten nitride (WN) film, and a tungsten film are successively overlaid and an insulating film 9 (i.e. silicon nitride film) is provided on side walls thereof.

TABLE 3

|  | $a_1$ | $a_2$ | $a_3$ | $a_4$ |
|---|---|---|---|---|
| before adjustment | −0.1015 | −0.0568 | −0.0495 | 0.1088 |
| after adjustment | −0.0057 | 0.0098 | −0.0201 | −0.0153 |

After the adjustment was performed, measurement identical to that of Embodiment 1 was conducted again and results shown in the lower column of Table 3 were obtained. By comparing the two results, it was confirmed that the aberrations were successfully reduced. In addition, semiconductor integrated circuit equipment was manufactured by incorporating a projection exposure apparatus equipped with the lens that had been adjusted. FIG. 4(b) is a top view and a sectional view of a semiconductor device that was fabricated by the use of the lens after the adjustment, making a contrast with the results of similar fabrication by the use of the lens without the adjustment. It was verified that the above-described amount of shift in the image can be counterbalanced greatly by making the adjustment based on the measurement results of Embodiment 1. By this procedure, it was made possible to manufacture semiconductor integrated circuit equipment that can manufacture semiconductor integrated circuits having excellent electric characteristics with a high yield.

Embodiment 3

In Embodiment 3, the above-described method of Embodiment 2 was further applied to another projection lens. In this case, however, it turned out to be difficult to reduce its aberrations sufficiently only by adjusting the projection lens. In view of the results, residual aberration after the adjustment of the lens was measured in a whole exposure area (the aberrations being dependent on the position in the exposure area), and its influence on a device pattern was estimated through simulation. Next, based on this estimation, positions of patterns on the mask were corrected in such a manner that the amount of correction was dependent on each position in the exposure area. To implement the correction of positions, a correction function for correcting a drawing position of a mask drawing apparatus was utilized. Techniques for mask correction are described in the article by Asai, et al., "Proposal for the Coma Aberration Dependent Overlay Error Compensation Technology", in *Jpn. J. Appl. Phys.*, vol. 37 (1998), pp. 6718–6722 (Part 1, No. 12B, December 1998), the contents of which are incorporated herein by reference in their entirety.

In addition, for an extremely fine memory pattern of a memory integrated circuit, dimensions of a mask pattern were also corrected. This correction was intended to resolve a fact that the dimensions of the transferred pattern cannot be the same as those of the designed pattern due to the residual aberration. Several types of memory cell patterns were prepared beforehand, each of which had been corrected optimally for a specific position in the exposure area where the amount and direction of the aberration were specific, and in manufacturing a mask, an optimal cell pattern was chosen among them and arranged in the mask according to its position. The present Embodiment was verified to enable the formation of semiconductor integrated circuit patterns with a required accuracy even when the residual aberration existed in the projection lens.

Embodiment 4

In the present embodiment, an alternative method for determining the aberrations will be described. First, a basic idea of the method is described. Suppose that the wavefront aberration W is expressed with a polynomial comprising a summation of terms as shown below.

$$W(X,Y)=a_1 W_1(X,Y)+ \ldots +a_m W_m(X,Y),$$

where $a_j$ is a coefficient of the j-th aberration term, and X and Y denote coordinates on the pupil. Determining the aberrations is nothing more or less than finding $a_j$ (j=1, ... m). The coherent image amplitude distribution u(x,y) for this case is given by the following formula.

$$\begin{aligned}u(x, y) &= mask(x, y)(X)psf(x, y)\\ &= mask(x, y)(X)F[P(X, Y) \cdot \exp(-i \cdot (a_1 W_1(X, Y) + \ldots + \\ &\quad a_m W_m(X, Y))]\\ &= mask(x, y)(X)F[P(X.Y) \cdot (1 - i \cdot (a_1 W_1(X, Y) + \ldots + \\ &\quad a_m W_m(X, Y)))]\\ &= u_0(x, y) - i \cdot [a_1 mask(x, y)(X)F[W_1(X, Y)P(X, Y)] + \\ &\quad a_m mask(x, y)(X)F[W_m(X, Y)P(X, Y)],\end{aligned}$$

where A (X) B denotes the convolution integral of A and B, F[C] the Fourier transform of C, mask(x,y) the complex amplitude transmittance distribution of mask, psf(x,y) the point spread function, P(X,Y) the pupil function, and $u_0(x,y)$ the coherent image amplitude distribution with zero aberration (=mask(x,y) (X) F[P(X,Y)]).

In deriving the expression in the third line from one in the second line above, an approximation was used assuming that the value of $a_1 W_1(X,Y)+ \ldots +a_m W_m(X,Y)$ is sufficiently small. From the above equation one obtains $$\Delta u(x,y)=u(x,y)-u_0(x,y)=S_1 a_1+S_2 a_2+ \ldots +S_m a_m,$$

where $S_j=-i \cdot mask(x,y)$ (X) $F[P(X,Y)W_j(X,Y)]$.

If one measures the image amplitude distribution u(x,y) of the projected image of the test pattern at n different points in the projected image and calculates difference Δu(x,y) between the measured value and an ideal value $u_0(x,y)$ for each point, respectively, one can set up n linear equations having m unknowns $a_1, a_2, \ldots a_m$. One can determine respective aberration coefficients $a_1, a_2, \ldots a_m$ by solving the simultaneous equations.

A specific procedure for solving the equations will be explained in the followings. First, the light intensity I at each of the n points in the projected image of a given mask pattern is measured and then absolute amplitude value u is obtained by calculating the square root of the light intensity I, for all n points. In the measurement, it is desirable to employ an illumination condition of as high spatial coherence as possible. At the same time, ideal amplitude values at the above-described respective points are calculated through simulation and the vector $U=[\Delta u_1, \ldots \Delta u_n]^t$ whose components are differences between the above-described measured amplitude values and the above-described ideal amplitude values at respective points $\Delta u_k$ (k=1, ... n) is generated, where $V^t$ represents the transposed matrix of Matrix V. Next, regarding the j-th aberration term (j=1, ... m) when the wavefront aberration is assumed to be expressed by the above-described polynomial, the convolution integral of F[P(X,Y)$W_j$(X,Y)] and the complex amplitude transmittance distribution of the mask pattern mask(x,y) is calculated for the k-th point (k=1, . . . n) on the projected mask, and designated as $T_{jk}$. That is, $T_{jk}$=mask(x,y) (X) F[P(X,Y)W$_j$(X,Y)] (at x=$x_k$, y=$y_k$). $T_{jk}$ is calculated for all measuring points (for all k) and for all aberration terms (for all j) to generate Matrix T=[$T_{jk}$], and then Vector A=[$a_1$, . . . $a_m$]$^t$ is found that satisfies the following matrix equation, namely linear simultaneous equations, comprising Matrix T and Vector U. The j-th element of Vector A is a coefficient in quest for the aberration term corresponding to the j-th row of Matrix T.

$$U=TA$$

In this calculation, it is more desirable that the number of measuring points n is larger than the number of aberration terms m and that the larger the number n, the better the calculation. In this case, the most reasonable solution for vector A is the one that minimizes |TA-U|. This problem can easily be solved by means of the so-called singular value decomposition technique.

However, in practice it is often difficult to measure absolute values of the light intensities. In such a case, the problem can be modified to circumvent the difficulty as follows. Choosing n point-pairs comprising n sets of two points $P_k$ and $Q_k$ (k=1, . . . n) on a projected image of a given mask pattern, the ratio between the light intensity at point $P_k$ and the light intensity at point $Q_k$ is measured, and then, calculating the square root of the ratio of the light intensities, the ratio between both absolute amplitude values $r_k$(k=1, . . . n) is obtained. Vector R=[$r_1$, . . . $r_n$]$^t$ whose components are the above-described amplitude ratios $r_k$(k=1, . . . n) at the above-described n point-pairs is generated. At the same time, regarding the above-described k-th point-pair (k=1, . . . n) and the j-th aberration term (j=1, . . . m), a value of $TP_{jk}$ at point $P_k$ and a value of $TQ_{jk}$ at point $Q_k$ are calculated. This procedure is performed for all point-pairs and for all aberration terms to generate Matrices TP=[$TP_{jk}$] and TQ=[$TQ_{jk}$]. Next, the following linear simultaneous equations for Matrices TP, TQ and Vector R are solved to find Vector A=[$a_1$, . . . $a_m$]$^t$, $$TP \cdot A - TQ \cdot A \cdot R^t = u_0(R^t - 1),$$

where $u_0$ is the value of coherent amplitude value at each point in case an ideal optical system would be employed.

The j-th element of Vector A is a coefficient for the j-th aberration term. Also in this case, it should be recommended that an illumination condition of as high a spatial coherence as possible is employed and the number of point-pairs at which measurement is to be conducted is chosen to be larger than the number of aberration terms which is to be found, as is the case of the foregoing description. Moreover, an optimum solution can be easily obtained by means of the singular value decomposition technique, as is the case of the foregoing description.

Embodiment 5

Here, an example will be described in which four coefficients of the aberration terms, which are identical to those described in Embodiment 1, were determined by using a hole pattern on an attenuating phase-shifting mask, based on Embodiment 4.

First, a coherent image amplitude distribution $u_j$ (x,y)= mask(x,y) (X) F[P(X,Y)W$_j$(X,Y)] in which respective aberration terms are taken as substantial pupil functions is calculated for the projected image of the hole pattern on an attenuating phase-shifting mask and respective angle dependencies of sidelobe amplitudes at respective point $v_1$(q), $v_2$(q), $v_3$(q), and $v_4$(q) are obtained. Next, the sidelobe intensities are measured at four arbitrary angles. For example, obtained are angle $q_1$ and the amount of exposure $E_1$ at which a first sidelobe emerges when the amount of exposure is increased, angle $q_2$ and the amount of exposure $E_2$ at which a second sidelobe emerges, angle $q_3$ and the amount of exposure $E_3$ at which a third sidelobe emerges, and angle $q_4$ and the amount of exposure $E_4$ at which all sidelobes eventually merge into one at the circumference of the projected image of the hole pattern, through measurement. From reciprocals of $E_1$ through $E_2$ and the so-called threshold intensity (i.e. the amount of exposure at which the thickness of a resist film after development at a large-area opening in the pattern becomes zero), the sidelobe intensities $u_1$, $u_2$, $u_3$, and $u_4$ at respective angles are obtained. Coefficients in quest $a_1$, $a_2$, $a_3$, and $a_4$ can be found by solving the following simultaneous equations.

$$a_1 v_1(q_1) + a_2 v_2(q_1) + a_3 v_3(q_1) + a_4 v_4(q_1) = u_1 - u_0$$

$$a_1 v_1(q_2) + a_2 v_2(q_2) + a_3 v_3(q_2) + a_4 v_4(q_2) = u_2 - u_0$$

$$a_1 v_1(q_3) + a_2 v_2(q_3) + a_3 v_3(q_3) + a_4 v_4(q_3) = u_3 - u_0$$

$$a_1 v_1(q_4) + a_2 v_2(q_4) + a_3 v_3(q_4) + a_4 v_4(q_4) = u_4 - u_0$$

By this method, almost the same results as those of Embodiment 1 were obtained.

In case the above-described hole pattern is sufficiently small in dimensions (more specifically, in case its transferred pattern can be assumed to be substantially circular), a square pattern may be used instead. In case a pattern larger than such pattern is employed, it is desirable to chose a circular pattern or a polygon pattern which is as close to a circle as possible.

As understood from the foregoing description, according to the present invention, when measuring characteristics of a projection lens that is used to form a pattern on a substrate by projecting light passing through a mask containing a circuit pattern thereon onto the above-described substrate to perform exposure through the projection lens, m aberration coefficients can be accurately found by steps of: measuring the light intensities of the projected image of the pattern at n different points in the projected image, the pattern being located within an isoplanatic area of the projection lens on the mask, in which the above-described characteristic is to be measured; and solving n simultaneous equations having m unknown weighting coefficients for m (m≦n) known wavefront aberration functions. Further, according to the present invention, a circuit pattern for a semiconductor integrated circuit can be accurately formed either by:

using the above-described projection lens whose aberration characteristic was adjusted based on its characteristic thus found; or taking steps of estimating the influence of the projection lens on the change in dimensions and/or shift in positions of the image of the pattern on the mask, based on its characteristics thus found, and forming a pattern on the substrate by using the mask that was corrected beforehand to counterbalance the influence.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A method for determining aberrations of a projection lens which is used to project a pattern formed on a mask onto a body, comprising the steps of:

measuring light intensities of a projected image of a test pattern at different points in said projected image, said test pattern being located within an isoplanatic area of said projection lens on said mask; and finding m aberration coefficients by solving n simultaneous equations (m being an integer not larger than n) having said m aberration coefficients, wherein y(y=m) weighting coefficients in said simultaneous equations are treated as unknown for z(z=m) known wavefront aberration functions in said simultaneous equations, and said simultaneous equations include the result of said measuring light intensities.

2. A method for determining aberrations of a projection lens according to claim 1, wherein said mask used for determining said aberrations is an attenuating phase-shifting mask, and said light intensities are light intensities of sidelobes that emerge in a portion of said projected image of said attenuating phase-shifting mask.

3. A method for determining aberrations of a projection lens according to claim 1, wherein said solving n simultaneous equations determines third- and fifth-order coma aberrations of said projection lens.

4. A method for determining aberrations of a projection lens according to claim 1, wherein said different points are placed at symmetric points of the projected image of the test pattern.

5. A method for determining aberrations of a projection lens according to claim 1, wherein said mask used for determining said aberrations is an attenuating phase-shifting mask, said test pattern is a pattern containing x-pairs of edges which are parallel and symmetric to each other, the step of measuring said light intensities of said projected image includes processes of:

transferring the pattern containing said x-pairs of edges on said mask onto a resist film formed on said body with different amounts of exposure through said projection lens; and measuring said amounts of exposure at which a sidelobe emerges at the vicinity of said each pair of edges of said projected image of said test pattern, on respective sides of an attenuating phase-shifting light shielding portion of said projected image, and said m aberration coefficients are found by solving n simultaneous equations using ratios, each of which is calculated from said amounts of exposure which were obtained for each of said x-pairs of edges.

6. A method for determining aberrations of a projection lens according to claim 5, wherein said x-pairs of edges which are parallel and symmetric to each other are respective pairs of opposed sides of an octagonal opening located in an attenuating phase-shifting partially light-shielding portion of said mask, and wherein four coma aberration coefficients a1, a2, a3, and a4 of said projection lens are found by steps of:

measuring the amount of exposure g at which a sidelobe emerges at one side of each pair of said opposed sides of said projected image of said octagonal opening in a direction normal to said opposed sides ($\theta$=0, P/4, P/2, 3P/4) and the amount of exposure h at which sidelobes emerge at both sides of each pair of said opposed sides of said projected image, for four pairs of said opposed sides of said projected image;

calculating the ratio r($\theta$) of h to g, for the four pairs of said opposed sides of said projected image, to find the maximum value of the wavefront aberrations f($\theta$) thereby for each direction ($\theta$=0, P/4, P/2, 3P/4), respectively; and then solving the following simultaneous equations, $$a1w1(\theta) + a2w2(\theta) + a3w3(\theta) + a4w4(\theta) = f(\theta)(\theta = 0, P/4, P/2, 3P/4)$$

wherein $w1(\theta) = \cos(\theta),$
$w2(\theta) = \sin(\theta),$
$w3(\theta) = \cos(\theta),$
$w4(\theta) = \sin(\theta).$ 7. A method for forming patterns, wherein said patterns are formed by use of said projection lens whose aberration characteristic was adjusted based on the amounts of aberrations which were determined by the method for determining aberrations of a projection lens as set forth in claim 1.

8. A method for forming patterns, comprising the steps of:

determining aberrations of said projection lens by the method as set forth in claim 1;

adjusting said projection lens based on said determination of said aberrations, leaving residual aberrations;

estimating influence of said residual aberrations;

correcting said mask so as to counterbalance said influence, so as to form a corrected mask; and forming patterns using said corrected mask.

9. A corrected mask produced by a process comprising the steps of:

determining aberrations of said projection lens by the method as set forth in claim 1;

adjusting said projection lens based on said determination of said aberrations, leaving residual aberrations;

estimating influence of said residual aberrations; and correcting said mask so as to counterbalance said influence.

10. A method for determining aberrations of a projection lens according to claim 1, wherein said test pattern has an octagonal opening.

11. A method for correcting a projection lens which is used to project a pattern formed on a mask onto a body, comprising the steps of:

measuring light intensities of a projected image of a test pattern at different points in said projected image, said test pattern being located within an isoplanatic area of said projection lens on said mask;

finding m aberration coefficients by solving n simultaneous equations (m being an integer not larger than n) having said m aberration coefficients, wherein y(y=m) weighting coefficients in said simultaneous equations are treated as unknown for z(z=m) known wavefront aberration functions in said simultaneous equations, and said simultaneous equations include the result of said measuring light intensities; and adjusting said projection lens based on said aberration coefficients.

12. A method for correcting a projection lens according to claim 11, wherein said test pattern has an octagonal opening.

13. A method for determining aberrations of a projection lens which is used to project a pattern formed on a mask onto a body, comprising the steps of:

measuring light intensities of a projected image of a test pattern at different points in said projected image, said test pattern having an octagonal opening, said test pattern being located within an isoplanatic area of said projection lens on said mask; and finding m aberration coefficients by solving n simultaneous equations (m being an integer not larger than n) having said m aberration coefficients for m known wavefront aberration functions, and said simultaneous equations include the result of said measuring light intensities.

* * * * *